US006916716B1

(12) United States Patent
Goad et al.

(10) Patent No.: US 6,916,716 B1
(45) Date of Patent: Jul. 12, 2005

(54) ASYMMETRIC HALO IMPLANTS (75) Inventors: Scott Goad, Pflugerville, TX (US); James C. Pattison, Round Rock, TX (US); Edward Ehrichs, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 54 days.

(21) Appl. No.: 10/693,016

(22) Filed: Oct. 24, 2003

(51) Int. Cl.$^7$ .............................................. H01L 21/426
(52) U.S. Cl. ...................... 438/276; 438/290; 438/302; 438/306; 438/525; 438/527
(58) Field of Search ................................ 438/276, 289, 438/290, 302, 306, 525, 526, 527

(56) References Cited

U.S. PATENT DOCUMENTS

| 5,227,321 A | | 7/1993 | Lee et al. ................... 438/232 |
|---|---|---|---|
| 5,580,804 A | * | 12/1996 | Joh ............................. 438/231 |
| 6,030,871 A | * | 2/2000 | Eitan .......................... 438/276 |
| 6,114,211 A | | 9/2000 | Fulford et al. ............. 438/305 |
| 6,489,223 B1 | * | 12/2002 | Hook et al. ................. 438/524 |
| 6,620,679 B1 | * | 9/2003 | Tzeng et al. ................ 438/250 |
| 6,828,202 B1 | * | 12/2004 | Horch .......................... 438/302 |
| 2003/0032231 A1 | * | 2/2003 | Efland et al. ............... 438/200 |

OTHER PUBLICATIONS

Edward Ehrichs, "Simplified Masking for Asymmetric Halo," U.S. Appl. No. 10/883,925, filed Jul. 2, 2004.

Stanley Wolf and Richard N. Tauber; *Silicon Processing for the VLSI Era, vol. 3—The Submicron MOSFET;* pp. 226–232, 240, 309–311, and 621–622; 1995.

Terence B. Hook et al.; *High–Performance Logic and High–Gain Analog CMOS Transistors Formed by a Shadow–Mask Technique With a Single Implant Step;* IEEE Transactions on Electron Devices, vol. 49, No. 9, Sep. 2002; pp. 1623–1627.

* cited by examiner

*Primary Examiner*—Stephen W. Smoot
(74) *Attorney, Agent, or Firm*—Timothy M. Honeycutt (57) ABSTRACT

Various methods of fabricating halo regions are disclosed. In one aspect, a method of manufacturing is provided that includes forming a symmetric transistor and an asymmetric transistor on a substrate. A first mask is formed on the substrate with a first opening to enable implantation formation of first and second halo regions proximate first and second source/drain regions of the symmetric transistor. First and second halo regions of a first dosage are formed beneath the first gate by implanting off-axis through the first opening. A second mask is formed on the substrate with a second opening to enable implantation formation of a third halo region proximate a source region of the second asymmetric transistor while preventing formation of a halo region proximate a drain region of the asymmetric transistor. A third halo region of a second dosage greater than the first dosage is formed by implanting off-axis through the second opening.

28 Claims, 6 Drawing Sheets

ASYMMETRIC HALO IMPLANTS

BACKGROUND OF THE INVENTION

1. Field of the Invention

This invention relates generally to semiconductor processing, and more particularly to methods of forming halo regions.

2. Description of the Related Art

A typical field effect transistor implemented on a semiconductor substrate consists of a gate dielectric layer-gate electrode stack positioned on the substrate, and opposing source/drain impurity regions positioned in the substrate below the stack. The lateral separation between the pn junctions of the source/drain regions generally defines the channel length of the transistor. Some source/drain regions include extension regions that project laterally into the channel beneath the gate. When lightly doped, these extension structures are sometime called lightly doped drains ("LDD"). The purpose of the LDD structures is to provide a region of lighter doping beneath the gate electrode to reduce the drain junction potential.

Scaling of field effect transistor devices has historically been, and continues to be a fundamental goal in the semiconductor fabrication industry. The continual drive toward higher circuit density has been fueled by demands from ordinary consumers, industry, government and the military for ever increasing speed, capability and miniaturization of electronic products, as well as the desire of semiconductor manufacturers to reduce manufacturing costs. Scaling efforts have thus far been highly successful. Two micron processing, considered state of the art a little more than a decade ago, has given way to sub-micron processing.

As in many aspects of semiconductor processing, current efforts to scale transistor geometry involve a set of trade-offs between higher packing density, improved device performance, and short channel effects. As process technologies scaled below about 2.0 $\mu$m, a series of design difficulties arose stemming from the semiconductor physics associated with short-channel devices. Hot carrier effects and punch-through become much more problematic in short channel devices, such as modern field effect transistors in sub-2.0 $\mu$m processing. Without compensatory processing techniques, short channel effects can either reduce device performance or lead to device failure or both.

Halo structures have been used for several years in n-channel, p-channel and CMOS technologies as a means of controlling short channel effects in sub-0.5 $\mu$m critical dimension processing. A conventional halo structure consists of an implanted impurity region positioned lateral to the LDD of each source/drain region and provided with the same conductivity type as the channel. The conventional method of fabricating a halo structure entails a single large-angle-tilted ("LAT") ion implant that positions the halo structure around and under the vertical junctions of both the LDD and the overlapping heavier doped portion of the source/drain region. Halo regions are formed on both the source side and the drain side of the channel.

A difficulty associated with conventionally produced halo structures is the potential for limitations on carrier mobility and drive current to exist for a given level of leakage current. Halo regions positioned proximate both the source side and the drain side present an impediment to carrier mobility. The ability to reduce barriers to carrier mobility without significant increases in leakage currents holds the promise of squeezing even more performance out of halo implanted transistors.

The present invention is directed to overcoming or reducing the effects of one or more of the foregoing disadvantages.

SUMMARY OF THE INVENTION

In accordance with one aspect of the present invention, a method of manufacturing is provided that includes forming a symmetric transistor and an asymmetric transistor on a substrate. The symmetric transistor has a first gate on the substrate, and a first source/drain region and second source/drain region in the substrate. The asymmetric transistor has a second gate on the substrate, and a first source region and a first drain region in the substrate. A first mask is formed on the substrate with a first opening to enable implantation formation of first and second halo regions proximate the first and second source/drain regions of the symmetric transistor. The first and second halo regions of a first dosage are formed beneath the first gate by implanting off-axis through the first opening at a first twist angle and then a second and substantially opposite twist angle. The first mask is removed and a second mask is formed on the substrate with a second opening to enable implantation formation of a third halo region proximate the first source region of the second asymmetric transistor but prevent formation of a halo region proximate the first drain region. The third halo region of a second dosage greater than the first dosage is formed by implanting off-axis through the second opening.

In accordance with another aspect of the present invention, a method of manufacturing is provided that includes forming a symmetric transistor that has a first gate on a substrate, and a first source/drain region and second source/drain region in the substrate. An asymmetric transistor formed that has a second gate on the substrate, and a first source region and a first drain region in the substrate. A first mask is formed on the substrate. The first mask has a first opening that exposes a first portion of the first source/drain region proximate the first gate and a second portion of the second source/drain region proximate the first gate. First and second halo regions of a first dosage are formed beneath the first gate by implanting off-axis through the first opening at a first twist angle and then a second and substantially opposite twist angle. The first mask and the first gate shadow opposite portions of the substrate lateral to the first gate so that the first halo region forms beneath the first gate proximate the first portion of the first source/drain region and the second halo region forms beneath the first gate proximate the second portion of the second source/drain region. The first mask is removed and a second mask is formed on the substrate. The second mask has a second opening that exposes a first portion of the first source region proximate the second gate. A third halo region of a second dosage greater than the first dosage is formed proximate the first portion of the first source region by implanting off-axis through the second opening. The second mask and the second gate shadow portions of the substrate lateral to the second gate so that the third halo region forms beneath the second gate proximate the first portion of the first source region, bit no halo region forms proximate the first drain region.

In accordance with another aspect of the present invention, a method of manufacturing is provided that includes forming a symmetric transistor that has a first gate on a substrate, and a first source/drain region and a second source/drain region in the substrate. A first asymmetric transistor is formed that has a second gate on the substrate, a first source region and a first drain region in the substrate.

A second asymmetric transistor is formed that has a third gate on the substrate, a second source region adjacent to the first source region and a second drain region. A first mask is formed on the substrate, The first mask has a first opening that exposes a first portion of the first source/drain region proximate the first gate and a second portion of the second source/drain region proximate the first gate. First and second halo regions of a first dosage are formed beneath the first gate by implanting off-axis through the first opening at a first twist angle and then a second and substantially opposite twist angle. The first mask and the first gate shadow opposite portions of the substrate lateral to the first gate so that the first halo region forms beneath the first gate proximate the first portion of the first source/drain region and the second halo region forms beneath the first gate proximate the second portion of the second source/drain region. The first mask is removed and a second mask is formed on the substrate, The second mask has a second opening that exposes a first portion of the first source region proximate the second gate. A third halo region of a second dosage greater than the first dosage is formed proximate the first portion of the first source region by implanting off-axis at a third twist angle through the second opening. The second mask and the second gate shadow portions of the substrate lateral to the second gate so that the third halo region forms beneath the second gate proximate the first portion of the first source region, but no halo region forms proximate the first drain region. The second mask is removed and a third mask is formed on the substrate. The third mask has a third opening that exposes a first portion of the second source region proximate the third gate. A fourth halo region of a third dosage greater than the first dosage is formed proximate the first portion of the second source region by implanting off-axis at a fourth twist angle substantially to the third twist angle through the second opening, the third mask and the third gate shadow portions of the substrate lateral to the third gate so that the fourth halo region forms beneath the third gate proximate the first portion of the second source region, but no halo regions form proximate the first and second drain regions.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
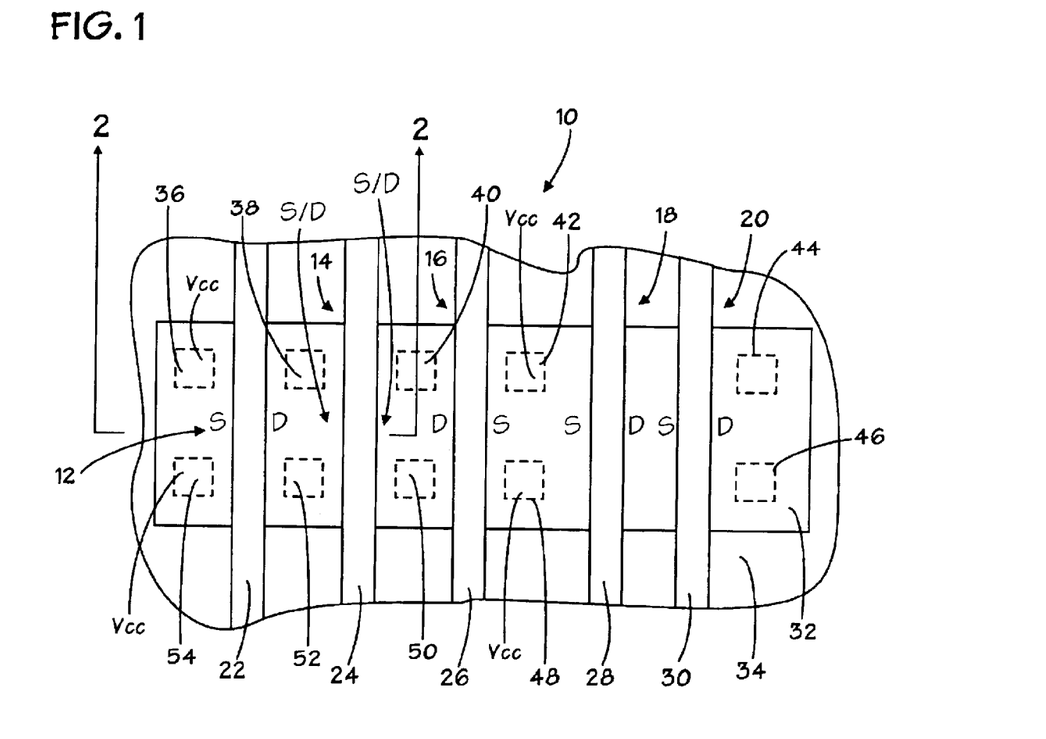
FIG. 1 is a plan view of a small portion of an integrated circuit in accordance with the present invention.

In the drawings described below, reference numerals are generally repeated where identical elements appear in more than one figure. Turning now to the drawings, and in particular to FIG. 1, therein is shown a plan view of a small portion of an integrated circuit 10. The integrated circuit 10 may include many circuit structures, such as resistors, transistors, capacitors and interconnects, to name just a few. A few of the possible circuit structures are depicted in FIG. 1, namely transistor devices 12, 14, 16, 18 and 20. The transistor devices 12, 14, 16, 18 and 20 consist of respective gate structures 22, 24, 26, 28 and 30 positioned over a shared active region 32 that is circumscribed by an isolation structure 34.

The gate structures 22, 24, 26, 28 and 30 may be fabricated by initially depositing a conducting or semiconducting material layer. The material layer may be composed of a variety of materials, such as, for example, polysilicon, amorphous silicon, aluminum, copper, gold, tantalum or the like. In an exemplary embodiment, the material is polysilicon. Well-known techniques for applying polysilicon, such as chemical vapor deposition ("CVD"), may be used to deposit the material layer. In an exemplary embodiment, the polysilicon is deposited by CVD at or above about 625° C. to a thickness of about 75.0 to 180.0 nanometers. Later impurity implants for source/drain regions to be described below will render the polysilicon conductive.

The active region 32 is part of a much larger substrate and may be composed of a variety of semiconducting materials, such as, for example, silicon, germanium, or the like. While a shared active region 32 is depicted, it should be understood that the transistor devices 12, 14, 16, 18 and 20 may be alternatively implemented on discrete active regions or a combination of shared and discrete active regions.

The isolation structure 34 is designed to provide lateral electrical isolation from other electrical structures on the integrated circuit 10. Various structural forms and electrically insulating materials may be used to fabricate the isolation structure 34, such as, for example, shallow trench isolation, deep trench isolation, field oxide, or other isolation structures composed of silicon dioxide, tetra-ethyl-orthosilicate ("TEOS"), or other suitable isolation materials.

Vertical electrical isolation for the active region 32 may be provided by impurity wells, by implementing the active region on a semiconductor-on-insulator substrate or other well-known techniques.

In the illustrated embodiment, the transistor devices 12, 14, 16, 18 and 20 are implemented as field effect transistors. The transistor devices 12, 16, 18 and 20 are implemented as "asymmetric transistors" and the transistor device 14 is implemented as a "symmetric transistor." In an asymmetric transistor, the source and drain do not swap functions during device operation. In a symmetric transistor by contrast, the source and drain do swap functions. Depending upon the interconnections to power, ground or other conductors and the bias state of the symmetric transistor, the portions of the active region on either side of the gate may function as either a source or a drain. This swapping of source and drain functions is useful in a variety of contexts in integrated circuits, such as, for example, as pass transistors in memory devices. The sources for each of the asymmetric transistors 12, 16, 18 and 20 are labeled "S". The drains for those transistors are labeled "D". The function swapping source/ drains for the symmetric transistor 14 are labeled "S/D".

The sources S, drains D and source/drains S/D may be formed using a variety of well-known techniques for forming source/drain regions such as, for example, ion implantation, diffusion, in-situ doping or the like.

The integrated circuit 10 is depicted in FIG. 1 at an intermediary stage of processing that occurs prior to the formation of contacts to the various sources S, drains D and source/drains S/D in the active region 32. The anticipated locations of the later-formed contacts are illustrated by the dashed boxes in the active region 32. Some of the contacts such as the contacts 36, 54, 42 and 48 may be connected to power and are additionally designated $V_{cc}$.

As noted above in the Background section, halo implants have been used as a means of altering the threshold voltage of a field effect transistor. The benefits of utilizing halo regions may be extended by tailoring the implant and masking scheme in order to account for differences between symmetric and asymmetric transistor devices. A goal of the process of the present invention may be understood by referring now also to FIG. 2, which is a cross-sectional view of FIG. 1 taken at section 2—2. The asymmetric device 12 and the symmetric device 14 are visible in FIG. 2, as well as the active region 32 and a small portion of isolation structure 34. At this stage, the gates 22 and 24 of the devices 12 and 14 may have a lateral dimension 2.0λ where λ is some targeted final lateral dimension. For example, the dimension 2.0λ may represent the width of the gates 22 and 24 following lithographic and etch patterning, while the dimension A may represent the width of the gates 22 and 24 following one or more trim processes, such etch trims. The gates of the other devices 16, 18 and 20, which are not visible in FIG. 2, may have the same lateral dimension as the gates 22 and 24.

Figure 2:
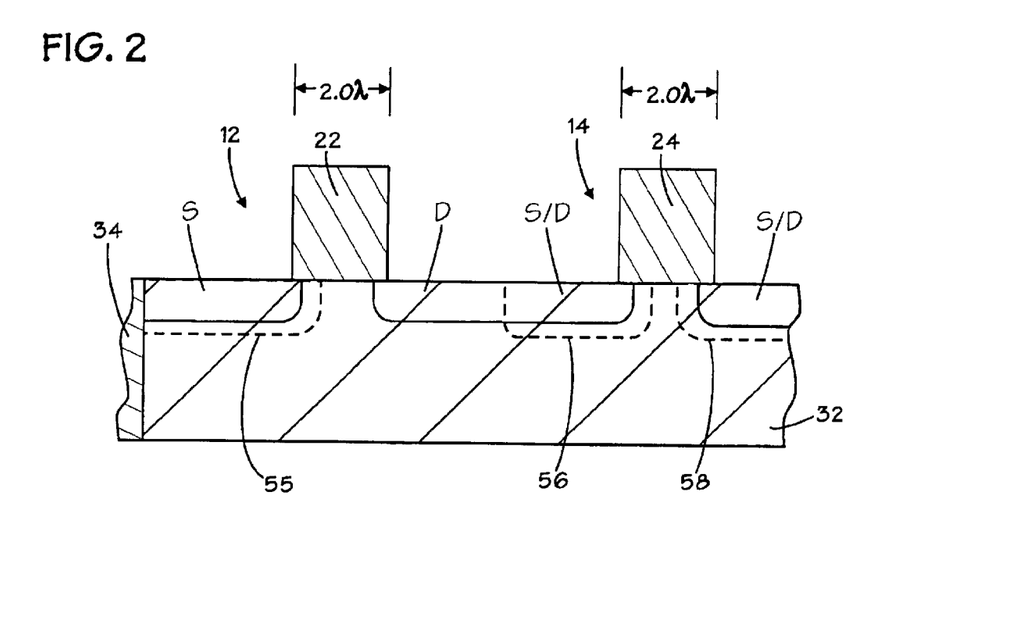
FIG. 2 is a cross-sectional view of FIG. 1 taken at section 2—2 in accordance with the present invention.

The device 12 includes a source S and shares an impurity region with the device 14. The portion of the shared impurity region proximate the gate 22 of the asymmetric device 12 is implemented as a drain D but the portion proximate the gate 24 for the symmetric device 14 is implemented as a source/ drain S/D as described above. The device 14 additionally has a shared impurity region, only a portion of which is visible, which is also implemented as a source/drain S/D. As described in more detail below, a masking and implant scheme is presented that provides for: (1) the formation of a halo region 55 with a nominal impurity dosage proximate the source S of the asymmetric transistor 12; (2) no formation of a halo region proximate the drain D of the asymmetric device; and (3) and the formation of halo regions 56 and 58 with nominal dosages that are smaller than the impurity region 55 and positions respectively proximate the source/drains S/D of the symmetric transistor 14. For example, the halo region 55 may be established with a nominal dosage 2.0X and the halo regions may be established with a smaller dosage X. The other asymmetric devices 16, 18 and 20 may be advantageously provided with asymmetric halo regions similar to the device 12 as depicted in FIG. 2.

Figure 3:
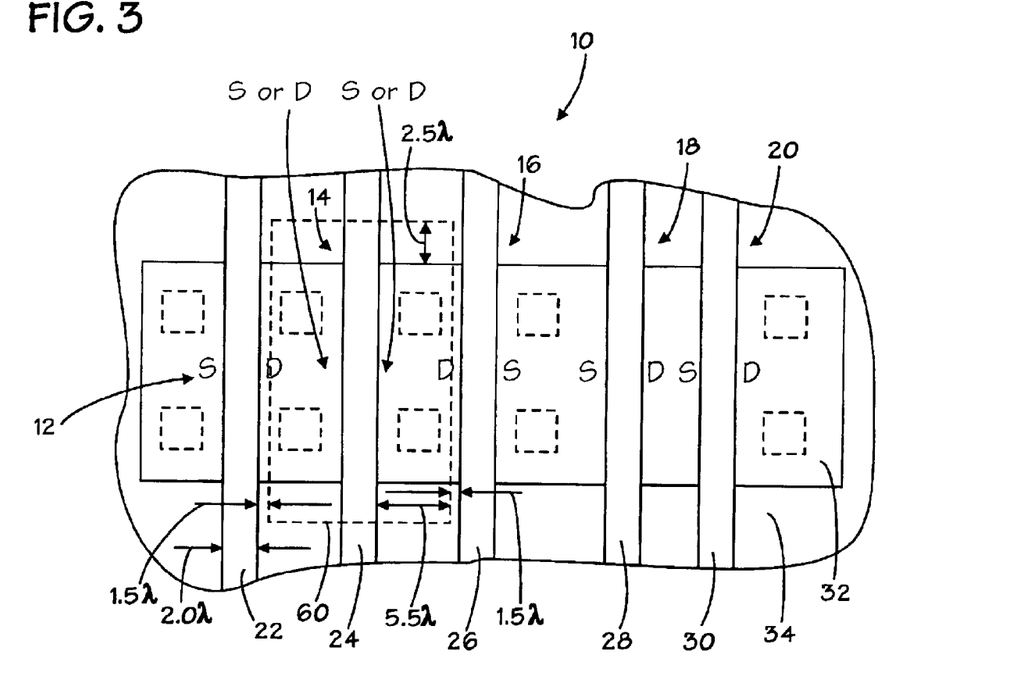
FIG. 3 is another plan view of the integrated depicted in FIG. 1 in accordance with the present invention.

An exemplary process flow for implementing the selective halo formation in accordance with the present invention may be understood by referring now to FIGS. 3, 4, 5, 6, 7, 8, 9, 10 and 11 and initially to FIG. 3. Like FIG. 1, FIG. 3 is a plan view of the integrated circuit 10. Assume for the purposes of illustration that it is desired to first perform halo implants for the symmetric device 14. The portion of the active region 32 targeted for halo implantation is illustrated by the dashed box 60. The dimensions of the target area 60 should be such that a later-formed mask with an opening corresponding to the layout of the target area 60 will shadow the drains D of the devices 12 and 16 during halo implantation to form halo regions 56 and 58 (see FIG. 2) beneath the gate 24. The actual dimensions of the target area 60 will depend on, inter alia, the height of the subsequently-formed mask, the dimension A, and some rules of thumb that are intended to account for potential errors in mask lithography. For example, the target area 60 may be dimensioned so that it: (1) extends laterally a distance of about 5.5λ to either side of the edges of the gate 24; (2) overlaps the isolation structure 34 by about 2.5λ; and (3) is spaced about 1.5λ from the opposing edges of the gates 22 and 26.

Figure 4:
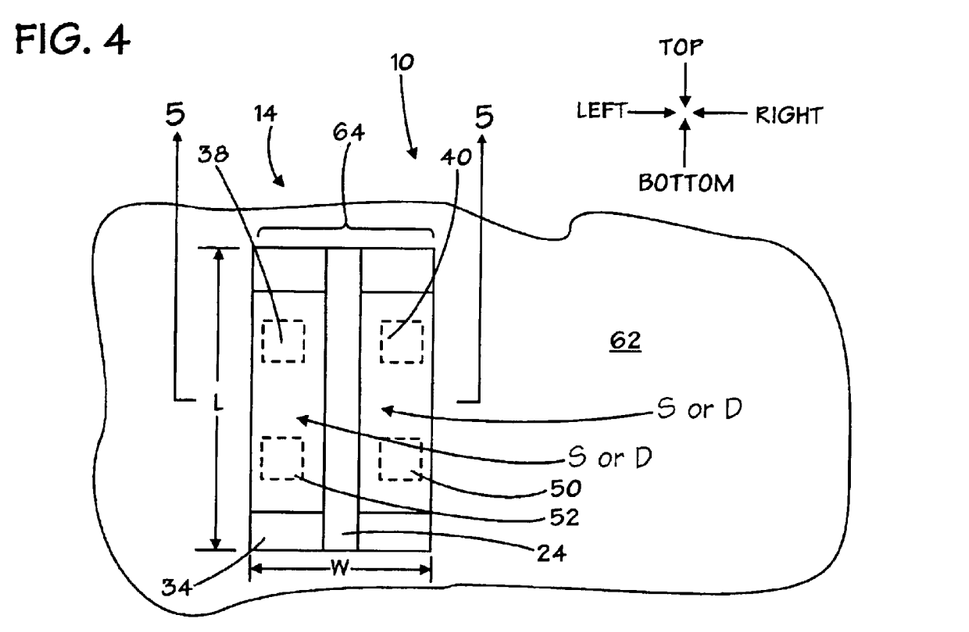
FIG. 4 is a plan view of the integrated circuit depicted in FIG. 3 with a mask formed thereon in accordance with the present invention.

FIG. 4 illustrates a plan view of a masking of the integrated circuit 10 that is a prelude to a halo implantation of the symmetric device 14. A mask 62 is patterned over the integrated circuit 10 with an opening 64 corresponding to the layout of the dashed box 60 in FIG. 3. The opening 64 may have a width W and a length L. Using the aforementioned rules of thumb, the width W may be about 13.0λ and the length L may be about 5.0λ plus the length of the active region 32. The mask 62 may be formed from positive or negative tone photoresist. The type of photoresist selected will depend on the wavelength of exposure radiation and ability of the resist to be applied with a desire thickness range. In an exemplary embodiment, a JSR Corp.'s KrF M20G positive tone photoresist may be used. Optionally, a hard mask of oxide, nitride, laminates of these or the like may be formed, albeit with a greater process complexity.

The opening 64 exposes portions of the underlying symmetric device 14. Note that portions of the active region 32, the isolation structure 34 and the gate 24 are visible. Again, the anticipated positions of the later-formed contacts 38, 40, 52 and 50 are depicted as well. It is desired to halo implant the active region 32 on both sides of and with substantial penetration beneath the gate 24. In this regard, "off-axis" implantation, that is, a tilted-angle implantation at an implant angle θ relative to vertical is used. Since halos are needed for both sides of the gate 24, the halo implants may be performed with a twist, that is, an angle relative to the long axis of the gate 24. The twist angle is usually orthogonal to the long axis of the gate 24 so that greatest penetration beneath the gate 24 is achieved However, the twist angle may be somewhat less than strictly perpendicular if desired. For the orientation of the gate 24 in FIG. 4, implants will be performed at a "RIGHT" and "LEFT" twist. If desired, halo implants may be performed at four different twists, such as "RIGHT," "LEFT," "TOP," and "BOTTOM" so that other devices on the integrated circuit that are, for example, perpendicular to the orientation of the symmetric device 14, will receive the symmetric halo implants as well. Note that the assignment of directions "RIGHT," "LEFT" etc. to the twist parameters in FIG. 4 is somewhat arbitrary.

Figure 5:
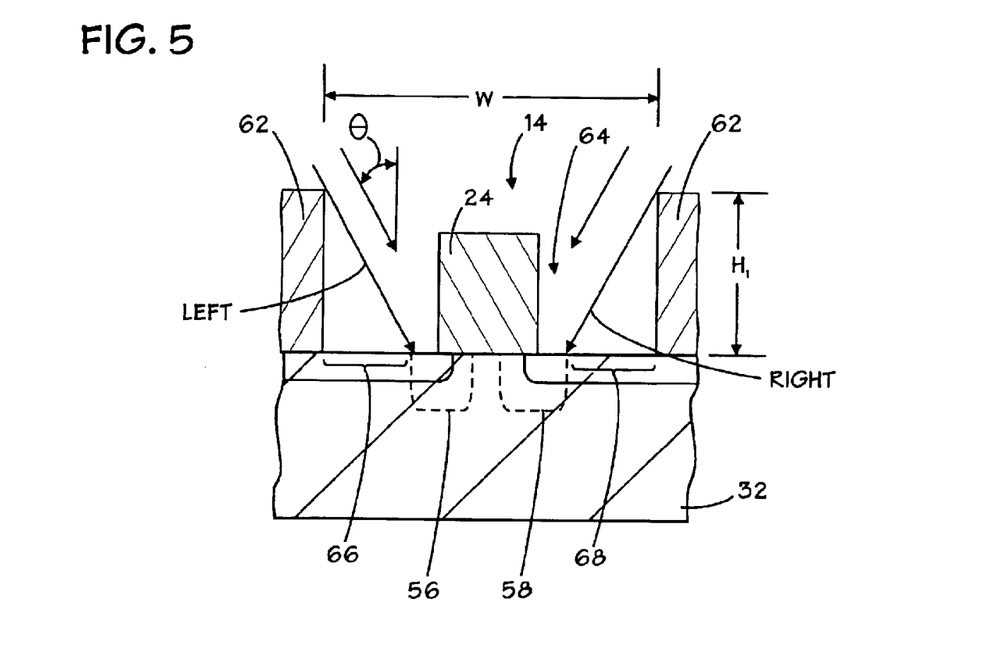
FIG. 5 is a cross-sectional view of FIG. 4taken at section 5—5 and depicts halo implantation of a portion of the integrated circuit in accordance with the present invention.

FIG. 5 depicts a cross-sectional view of FIG. 4 taken at section 5—5. The mask 62 is advantageously formed with a height $H_1$. The height $H_1$ is selected in conjunction with the width W of the opening 64 as described above so that the two (or optionally four) halo implants, one with a RIGHT twist and one with a LEFT twist and performed at an implant angle θ with respect to vertical, may establish symmetric X dosage halo regions 56 and 58 beneath the gate 24 as shown. The width W and the height $H_1$ are selected such that the portions 66 and 68 on either side of the gate 24 are effectively shadowed by the combination of the mask 62 and the gate 24 during implantation. In this way, halos will not be formed proximate the drains D of the asymmetric devices 12 and 16. In an exemplary embodiment, the height $H_1$ may be about 100.0 to 500.0 nm.

The parameters for the halo implants are largely matters of design discretion. In an exemplary embodiment, the species may be boron or $BF_2$ for a n-channel device and arsenic or antimony for a p-channel device. The energy may be about 3 to 80 keV, the nominal dosage X may be about 1E13 to 1E14 $cm^{-2}$ and the angle θ may be about 16 to 45°.

Following the implantation, the mask 62 is stripped. Stripping may be accomplished by ashing, solvent stripping, combinations of the two or the like.

Figure 6:
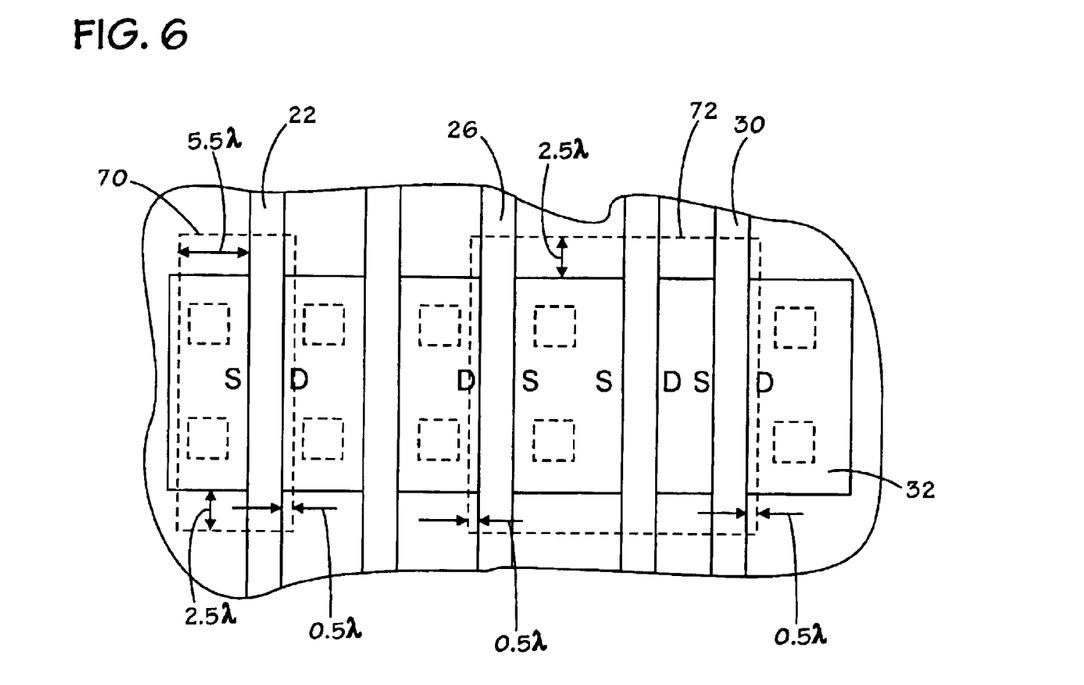
FIG. 6 is another plan view of the integrated depicted in FIG. 1 in accordance with the present invention.

With the halo regions 56 and 58 formed for the symmetric device 14, attention is now turned to the formation of the halo regions for the asymmetric devices 12, 16, 18 and 20. As depicted in FIGS. 6–11, this entails two masking steps. Bearing in mind the goal of providing source regions S with 2.0X dosage halos, two separate masking and implantation steps are provided, one each for BOTTOM and LEFT twists and one each for TOP and RIGHT twists. As noted elsewhere herein, the BOTTOM and TOP twists are optional. FIG. 6 depicts a plan view like FIG. 3 of the integrated circuit 10 showing the targeted areas for halo implantation at BOTTOM and LEFT twists. The regions targeted for implantation are illustrated by the dashed boxes 70 and 72. As with the masking for the symmetric implant depicted in FIGS. 3 and 4, the ultimate masking to provide open areas corresponding to the target regions 70 and 72 may be made with a few rules of thumb to guide the selection of dimensions for those regions 70 and 72. As shown, the region 70 may be formed so that it has a lateral dimension that overlaps to one side of the gate 22 of the device 12 by a distance 5.5 λ and on the other side to a distance of 0.5 λ. The overlap to either side of the active region 32 may be about 2.5 λ. The lateral dimension of the targeted region 72 may be selected so that there is a 0.5 λ overlap on one side of the gate 26 of the device 16 and the same 0.5 λ overlap on the opposite side of the gate 30 of the device 20 as shown. Again, the overlaps with the active region 32 may be about 2.5 λ.

Figure 7:
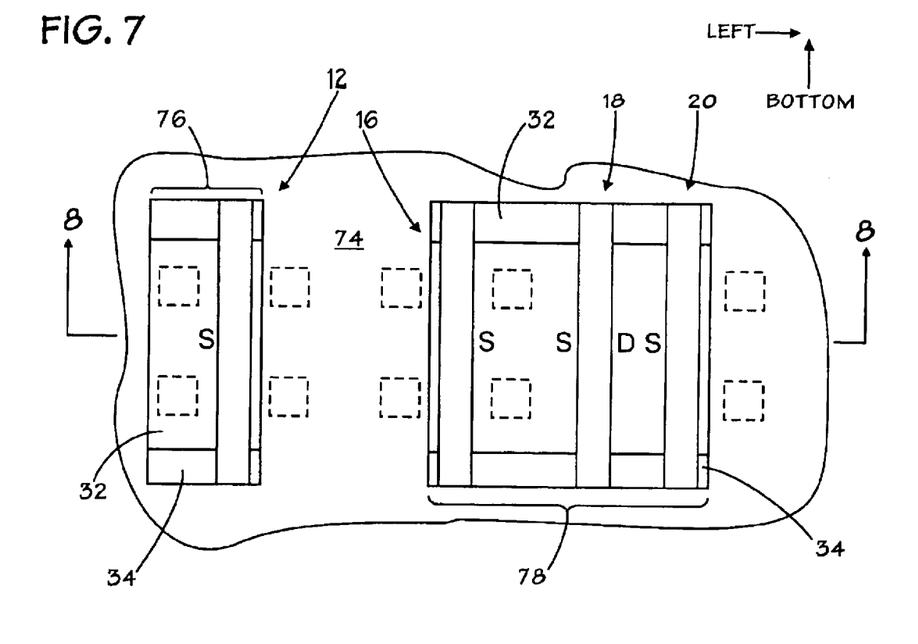
FIG. 7 is a plan view of the integrated circuit depicted in FIG. 6 with another mask formed thereon in accordance with the present invention.
Figure 8:
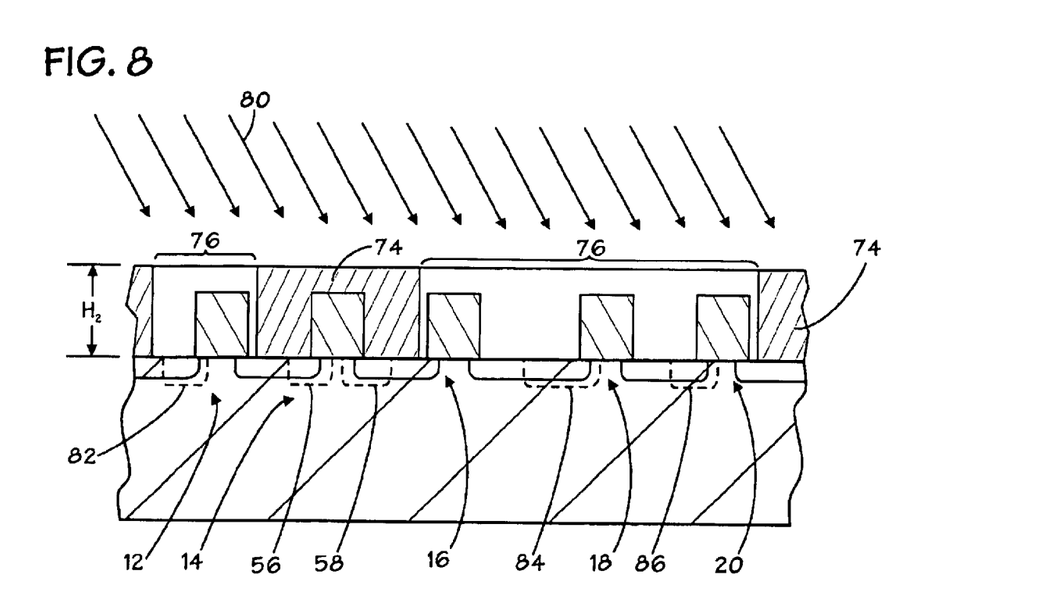
FIG. 8 is a cross-sectional view of FIG. 7 taken at section 8—8 and depicts halo implantation of another portion of the integrated circuit in accordance with the present invention.

A masking and implantation process corresponding to the desired targeted areas 70 and 72 is illustrated in FIGS. 7 and 8. FIG. 7 is a plan view of the integrated circuit 10 with a mask 74 formed thereon with openings 76 and 78 defined therein and FIG. 8 is a cross-sectional view of FIG. 7 taken at section 8—8. The mask 74 may be formed as described elsewhere herein. The opening 76 corresponds to the targeted region 70 and the opening 78 corresponds to the targeted region 72 shown in FIG. 6. Note that the openings 76 and 78 reveal portions of the underlying transistor devices 12, 16, 18 and 20 as well as the active region 32 and the isolation structure 34. As shown in FIG. 8, the mask 74 may be formed with a height, $H_2$. The $H_2$ and the length and width of the openings 76 and 78, as illustrated by the dimensions of the targeted regions 70 and 72 in FIG. 6, are selected so that when a halo implant at a LEFT twist is performed as represented by the arrows 80, halo regions 82, 84 and 86 will be formed while the halo regions 56 and 58 of the transistor 14 are shadowed by the combination of the gate 24 and the mask 74. In this way, the size or dosage of existing halo regions 56 and 58 will be unaffected. The parameters for the halo implant may be as generally described elsewhere herein. However, the dosage is selected to be greater than the nominal dosage X for the halo regions 56 and 58 described elsewhere herein. In an exemplary embodiment, the dosage is about 2.0X. Note that if a BOTTOM twist implant is also performed, dosage 2.0X halo regions will be formed in other asymmetric devices orthogonal to the devices depicted in FIG. 8 but not otherwise shown here. Following the implantation, the mask 74 is stripped using ashing, solvent stripping a combination of these or the like.

Figure 9:
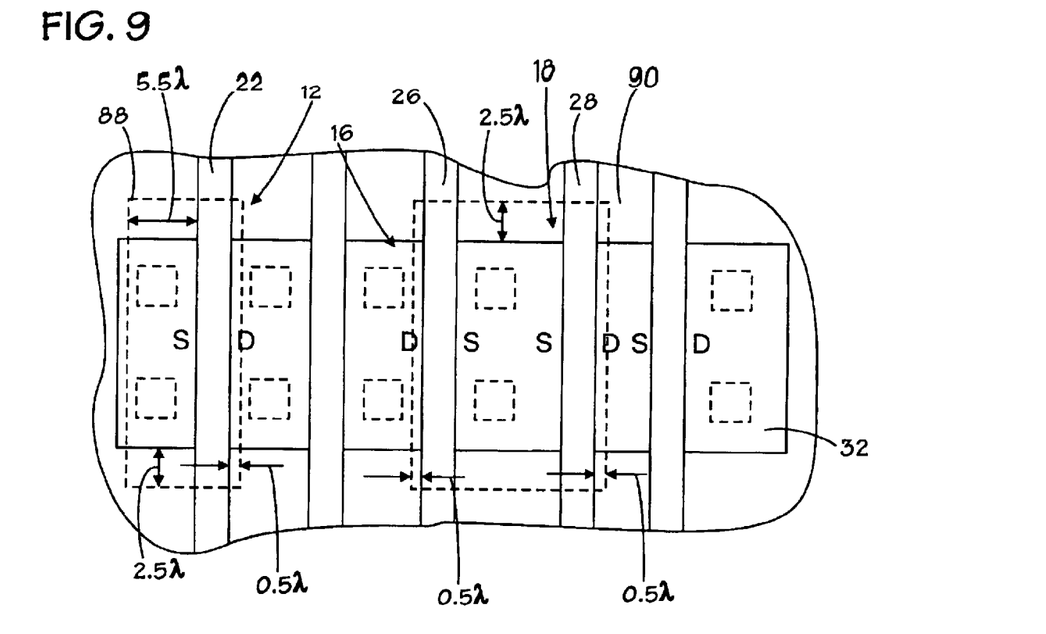
FIG. 9 is another plan view of the integrated depicted in FIG. 1 in accordance with the present invention.

With the halo regions 56 and 58 formed for the symmetric device 14, attention is now turned to the second masking and implantation step to perform a RIGHT (and optional TOP) twist implant in order to form a halo region for the source S of the asymmetric device 16. Referring now to FIG. 9, the regions targeted for implantation are illustrated by the dashed boxes 88 and 90. Note that the target region 88 is not truly necessary, and indeed may be eliminated, since the source region S for the device 12 has already been implanted and will be shadowed by the gate 22 during the subsequent RIGHT twist implant. As with the masking for the symmetric implant depicted in FIGS. 3 and 4, the ultimate masking to provide open areas corresponding to the target regions 88 and 90 may be made with a few rules of thumb to guide the selection of dimensions for those regions 88 and 90. As shown, the region 88 may be formed so that it has a lateral dimension that overlaps to one side of the gate 22 of the device 12 by a distance 5.5 λ and on the other side to a distance of 0.5 λ. The overlap to either side of the active region 32 may be about 2.5 λ. The lateral dimension of the targeted region 90 may be selected so that there is a 0.5 λ overlap on one side of the gate 26 of the device 16 and the same 0.5 λ overlap on the opposite side of the gate 28 of the device 18 as shown. Again, the overlaps with the active region 32 may be about 2.5 λ.

Figure 10:
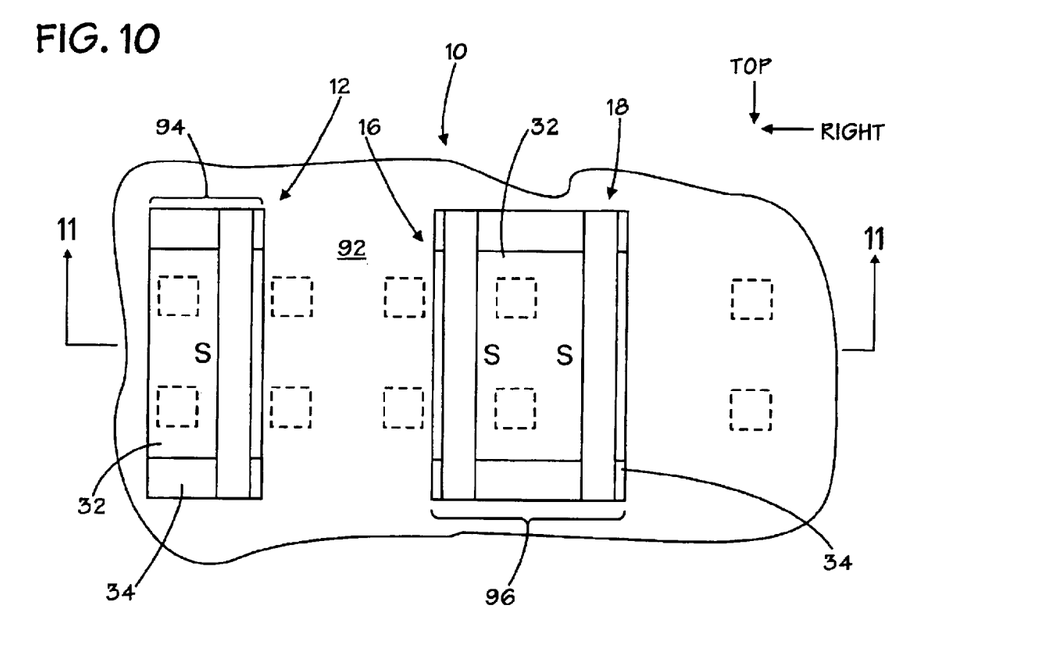
FIG. 10 is a plan view of the integrated circuit depicted in FIG. 9 with another mask formed thereon in accordance with the present invention.
Figure 11:
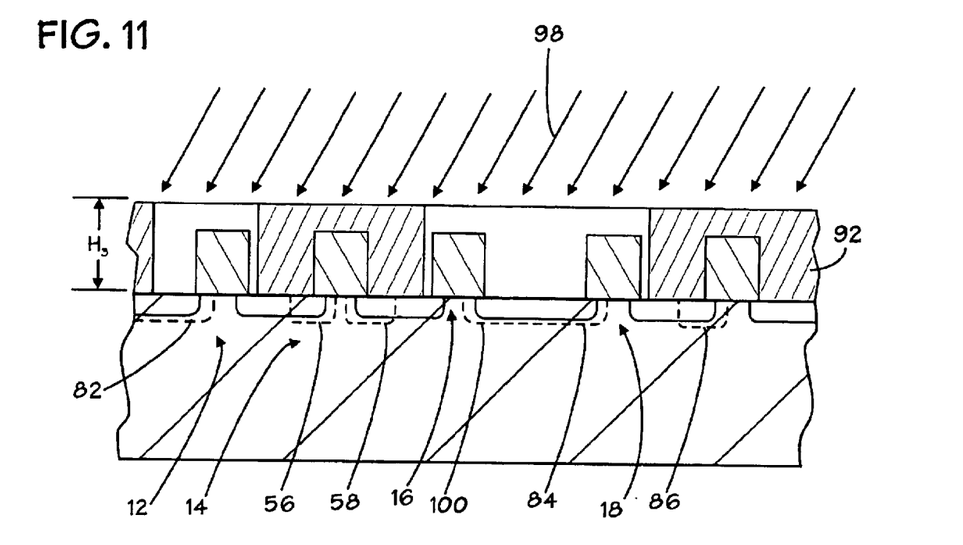
FIG. 11 is a cross-sectional view of FIG. 10 taken at section 11—11 and depicts halo implantation of another portion of the integrated circuit in accordance with the present invention.

A masking and implantation process corresponding to the desired targeted areas 88 and 90 is illustrated in FIGS. 10 and 11. FIG. 10 is a plan view of the integrated circuit 10 with a mask 92 formed thereon with openings 94 and 96 defined therein and FIG. 11 is a cross-sectional view of FIG. 10 taken at section 11—11. The mask 92 may be formed as described elsewhere herein. The opening 94 corresponds to the targeted region 88 and the opening 96 corresponds to the targeted region 90 shown in FIG. 9. Note that the openings 94 and 96 reveal portions of the underlying transistor devices 12, 16, and 18 as well as the active region 32 and the isolation structure 34. As shown in FIG. 11, the mask 92 may be formed with a height, $H_3$. The height $H_3$ and the length and width of the openings 94 and 96, as illustrated by the dimensions of the targeted regions 88 and 90 in FIG. 9, are selected so that when a halo implant at a RIGHT twist is performed as represented by the arrows 98, a halo region 100 will be formed while the halo regions 56 and 58 of the transistor 14 are shadowed. In this way, the size or dosage of existing halo regions 56 and 58 will be unaffected. The halo regions 84 and 86 will be similarly unaffected due to shadowing.

The parameters for the halo implant maybe as generally described elsewhere herein. However, the dosage of the halo implant is selected to be greater than the nominal dosage X for the halo regions 56 and 58 described elsewhere herein. In an exemplary embodiment, the dosage is about 2.0X. The energy, implant angle and species may be as described elsewhere herein. Note that if a TOP twist implant is also performed, dosage 2.0X halo regions will be formed in other asymmetric devices orthogonal to the devices depicted in FIG. 10 but not otherwise shown here. Following the implantation, the mask 92 is stripped using ashing, solvent stripping a combination of these or the like.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a symmetric transistor and an asymmetric transistor on a substrate, the symmetric transistor having a first gate on the substrate, a first source/drain region and second source/drain region in the substrate, the asymmetric transistor having a second gate on the substrate, a first source region and a first drain region in the substrate;
   forming a first mask on the substrate with a first opening to enable implantation of first and second halo regions proximate the first and second source/drain regions of the symmetric transistor;
   forming the first and second halo regions of a first dosage beneath the first gate by implanting off-axis through the first opening at a first twist angle and then a second and substantially opposite twist angle;
   removing the first mask;
   forming a second mask on the substrate with a second opening to enable implantation formation of a third halo region proximate the first source region of the second asymmetric transistor but prevent formation of a halo region proximate the first drain region; and
   forming the third halo region of a second dosage greater than the first dosage by implanting off-axis through the second opening.

2. The method of claim 1, wherein the second dosage is about twice the first dosage.

3. The method of claim 1, comprising forming the symmetric and asymmetric transistors on a shared active region.

4. The method of claim 1, wherein the symmetric transistor is formed adjacent to the asymmetric transistor.

5. The method of claim 1, wherein the symmetric transistor is not formed adjacent to the asymmetric transistor.

6. The method of claim 1, wherein the third halo region is formed by implanting at a RIGHT twist angle or a LEFT twist angle relative to the second gate.

7. The method of claim 1, wherein the second opening extends to either side of the second gate.

8. The method of claim 7, wherein the second opening extends different distances from opposite sides of the second gate.

9. A method of manufacturing, comprising:
   forming a symmetric transistor having a first gate on a substrate, a first source/drain region and second source/drain region in the substrate and an asymmetric transistor having a second gate on the substrate, a first source region and a first drain region in the substrate;
   forming a first mask on the substrate, the first mask having a first opening exposing a first portion of the first source/drain region proximate the first gate and a second portion of the second source/drain region proximate the first gate;
   forming first and second halo regions of a first dosage beneath the first gate by implanting off-axis through the first opening at a first twist angle and then a second and substantially opposite twist angle, the first mask and the first gate shadowing opposite portions of the substrate lateral to the first gate so that the first halo region forms beneath the first gate proximate the first portion of the first source/drain region and the second halo region forms beneath the first gate proximate the second portion of the second source/drain region;
   removing the first mask;
   forming a second mask on the substrate, the second mask having a second opening exposing a first portion of the first source region proximate the second gate; and
   forming a third halo region of a second dosage greater than the first dosage proximate the first portion of the first source region by implanting off-axis through the second opening, the second mask and the second gate shadowing portions of the substrate lateral to the second gate so that the third halo region forms beneath the second gate proximate the first portion of the first source region, but no halo region is formed proximate the first drain region.

10. The method of claim 9, wherein the second dosage is about twice the first dosage.

11. The method of claim 9, comprising forming the symmetric and asymmetric transistors on a shared active region.

12. The method of claim 9, wherein the symmetric transistor is formed adjacent to the asymmetric transistor.

13. The method of claim 9, wherein the symmetric transistor is not formed adjacent to the asymmetric transistor.

14. The method of claim 9, wherein the first and second halo regions are formed by implanting at a RIGHT twist angle and again at a LEFT twist angle relative to the first gate.

15. The method of claim 14, wherein the third halo region is formed by implanting at a RIGHT twist angle or a LEFT twist angle relative to the second gate.

16. The method of claim 9, wherein the second opening extends to either side of the second gate.

17. The method of claim 16, wherein the second opening extends different distances from opposite sides of the second gate.

18. A method of manufacturing, comprising:
    forming a symmetric transistor having a first gate on a substrate, a first source/drain region and second source/drain region in the substrate, a first asymmetric transistor having a second gate on the substrate, a first source region and a first drain region in the substrate, and a second asymmetric transistor having a third gate on the substrate, a second source region adjacent to the first source region and a second drain region;
    forming a first mask on the substrate, the first mask having a first opening exposing a first portion of the first source/drain region proximate the first gate and a second portion of the second source/drain region proximate the first gate;
    forming first and second halo regions of a first dosage beneath the first gate by implanting off-axis through the first opening at a twist angle and then a second and substantially opposite twist angle, the first mask and the first gate shadowing opposite portions of the substrate lateral to the first gate so that the first halo region forms beneath the first gate proximate the first portion of the first source/drain region and the second halo region forms beneath the first gate proximate the second portion of the second source/drain region;

removing the first mask;

forming a second mask on the substrate, the second mask having a second opening exposing a first portion of the first source region proximate the second gate; and forming a third halo region of a second dosage greater than the first dosage proximate the first portion of the first source region by implanting off-axis at a third twist angle through the second opening, the second mask and the second gate shadowing portions of the substrate lateral to the second gate so that the third halo region forms beneath the second gate proximate the first portion of the first source region, but no halo region is formed proximate the first drain region;

removing the second mask;

forming a third mask on the substrate, the third mask having a third opening exposing a first portion of the second source region proximate the third gate; and forming a fourth halo region of a third dosage greater than the first dosage proximate the first portion of the second source region by implanting off-axis at a fourth twist angle substantially opposite to the third twist angle through the second opening, the third mask and the third gate shadowing portions of the substrate lateral to the third gate so that the fourth halo region forms beneath the third gate proximate the first portion of the second source region, but no halo regions are formed proximate the first and second drain regions.

19. The method of claim 18, wherein the second dosage is about twice the first dosage.

20. The method of claim 18, comprising forming the symmetric and the first and second asymmetric transistors on a shared active region.

21. The method of claim 18, wherein the symmetric transistor is formed adjacent to one of the first and second asymmetric transistors.

22. The method of claim 18, wherein the symmetric transistor is not formed adjacent to either of the first and second asymmetric transistors.

23. The method of claim 18, wherein the first and second halo regions are formed by implanting at a RIGHT twist angle and again at a LEFT twist angle relative to the first gate.

24. The method of claim 23, wherein the third halo region is formed by implanting at a RIGHT twist angle or a LEFT twist angle relative to the second gate.

25. The method of claim 24, wherein the fourth halo region is formed by implanting at a RIGHT twist angle or a LEFT twist angle relative to the third gate.

26. The method of claim 18, wherein the second opening extends to either side of the second gate.

27. The method of claim 26, wherein the third opening extends to either side of the third gate.

28. The method of claim 27, wherein the second opening extends different distances from opposite sides of the second gate and the third opening extends different distances from opposite sides of the third gate.

* * * * *